United States Patent
Mori et al.

(10) Patent No.: US 10,093,815 B2
(45) Date of Patent: Oct. 9, 2018

(54) SURFACE TREATMENT AGENT AND SURFACE TREATMENT METHOD

(71) Applicant: TOKYO OHKA KOGYO CO., LTD., Kawasaki-shi (JP)

(72) Inventors: Daijiro Mori, Kawasaki (JP); Akira Kumazawa, Kawasaki (JP)

(73) Assignee: TOKYO OHKA KOGYO CO., LTD., Kawasaki-Shi (JP)

(*) Notice: Subject to any disclaimer, the term of this patent is extended or adjusted under 35 U.S.C. 154(b) by 3 days.

(21) Appl. No.: 15/268,904

(22) Filed: Sep. 19, 2016

(65) Prior Publication Data

US 2017/0088722 A1   Mar. 30, 2017

(30) Foreign Application Priority Data

Sep. 24, 2015 (JP) ................. 2015-186986
Jun. 21, 2016 (JP) ................. 2016-122761

(51) Int. Cl.

| | | |
|---|---|---|
| C09D 7/00 | (2018.01) | |
| C09D 7/63 | (2018.01) | |
| B08B 3/04 | (2006.01) | |
| C09D 5/00 | (2006.01) | |
| H01L 21/02 | (2006.01) | |
| H01L 21/306 | (2006.01) | |
| H01L 21/3105 | (2006.01) | |
| G03F 7/40 | (2006.01) | |
| C08K 5/34 | (2006.01) | |

(52) U.S. Cl.
CPC .......... *C09D 7/63* (2018.01); *B08B 3/04* (2013.01); *C09D 5/00* (2013.01); *G03F 7/405* (2013.01); *H01L 21/02057* (2013.01); *H01L 21/306* (2013.01); *H01L 21/3105* (2013.01); *H01L 21/31058* (2013.01); *C08K 5/34* (2013.01)

(58) Field of Classification Search
CPC .......................................... C09K 9/06
USPC ................................. 428/403–405
See application file for complete search history.

(56) References Cited

U.S. PATENT DOCUMENTS

| | | | |
|---|---|---|---|
| 4,950,635 A * | 8/1990 | Williams | B01D 15/08 210/198.2 |
| 5,326,672 A | 7/1994 | Tanaka et al. | |
| 5,702,767 A | 12/1997 | Peterson et al. | |
| 9,244,358 B2 * | 1/2016 | Koshiyama | C09K 3/18 |
| 2009/0226824 A1 * | 9/2009 | Kim | C08G 77/04 430/5 |
| 2011/0132397 A1 * | 6/2011 | Kumon | H01L 21/02052 134/6 |
| 2013/0146100 A1 * | 6/2013 | Saito | B08B 3/04 134/26 |
| 2014/0377957 A1 * | 12/2014 | Takeda | G03F 7/11 438/703 |

FOREIGN PATENT DOCUMENTS

| | | | |
|---|---|---|---|
| JP | H06-163391 | 6/1994 | |
| JP | H07-142349 | 6/1995 | |
| JP | H11-511900 | 10/1999 | |
| WO | WO 2010/047196 | * 4/2010 | |

* cited by examiner

Primary Examiner — Marc S Zimmer
(74) Attorney, Agent, or Firm — Knobbe Martens Olson & Bear LLP

(57) ABSTRACT

A surface treatment agent capable of effectively preventing pattern collapse of an inorganic pattern or a resin pattern provided on a substrate, and a surface treatment method using such a surface treatment agent. The surface treatment agent includes a silylation agent and a nitrogen-containing heterocyclic compound which does not include a silicon atom.

5 Claims, No Drawings

SURFACE TREATMENT AGENT AND SURFACE TREATMENT METHOD

This application claims priority to Japanese Patent Application No. 2015-186986, filed Sep. 24, 2015; and Japanese Patent Application No. 2016-122761, filed Jun. 21, 2016, the contents of which are incorporated herein by reference.

BACKGROUND OF THE INVENTION

Field of the Invention

The present invention relates to a surface treatment agent and a surface treatment method, and particularly relates to a surface treatment agent and a surface treatment method preferably applicable to surface treatment of a treatment target such as a substrate to be used in semiconductor integrated-circuit production.

Related Art

In the production of semiconductor devices and the like, lithography technology is applied prior to conducting processing such as etching on a substrate. With this lithography technology, a photosensitive resin composition is used to provide a photosensitive resin layer on the substrate, then this is selectively irradiated with and exposed to actinic radiation, and a developing process is performed, thereafter, the photosensitive resin layer is selectively dissolved and removed to form a resin pattern on the substrate. Then, an inorganic pattern is formed on the substrate by performing an etching process using this resin pattern as a mask.

Incidentally, in recent years, trends toward higher integration and miniaturization of semiconductor devices have grown, and thus progress toward refinement and higher aspect ratios of the inorganic pattern produced using a resin pattern as a mask and etching processes have advanced. In the meantime, however, a problem of so-called pattern collapse has arisen. This pattern collapse is a phenomenon in which when several resin patterns and inorganic patterns are formed on a substrate in parallel, adjacent patterns close in so as to lean on one another, and the patterns are damaged and peeled off from the base depending on the situation. If such pattern collapse occurs, the desired product will not be obtained, thereby causing a decline in the yield and reliability of the product.

This pattern collapse is known to occur when drying a cleaning liquid in a cleaning process after pattern formation, due to the surface tension of this cleaning liquid. In other words, when the cleaning liquid is removed in a drying step, stress based on the surface tension of the cleaning liquid has an effect between patterns, whereby pattern collapse occurs.

Consequently, numerous experiments have been carried out so far to prevent pattern collapse by adding a substance, which causes the surface tension to decrease, to the cleaning liquid. For example, a cleaning liquid to which isopropyl alcohol is added, a cleaning liquid to which a fluorine-based surfactant is added, and the like, have been proposed (refer to, for example, Patent Documents 1 and 2).

In addition, although not the same as pattern collapse, in order to improve adhesion between the resin pattern as the mask and the surface of the substrate to prevent a partial loss of the resin pattern by a chemical developing solution, hydrophobization treatment (silylation treatment) using hexamethyl disilazane (HMDS) has been being performed on the surface of the substrate before providing the substrate with a photosensitive resin layer (refer to, for example, "Background Art" of Patent Document 3).

Patent Document 1: Japanese Unexamined Patent Application, Publication No. H6-163391

Patent Document 2: Japanese Unexamined Patent Application, Publication No. H7-142349

Patent Document 3: Japanese Unexamined Patent Application (Translation of PCT Application), Publication No. H11-511900

SUMMARY OF THE INVENTION

However, with the cleaning liquid schemes described in Patent Documents 1 and 2, there has been a problem in that prevention of pattern collapse is insufficient. In addition, in a case of conducting silylation treatment on the surface of a treatment target such as a substrate using HMDS, time may be required in the silylation treatment and the desired effects may not be obtained because the silylation treatment of the surface of the treatment target is not sufficient.

The present invention has been made considering the above situation, and has an object to provide a surface treatment agent capable of effectively preventing pattern collapse of an inorganic pattern or a resin pattern provided on a substrate, and a surface treatment method using such a surface treatment agent. In addition, the present invention has another object to provide a surface treatment agent capable of carrying out silylation treatment on the surface of a treatment target to a high degree, and a surface treatment method using such a surface treatment agent.

In order to solve the abovementioned problems, the present inventors have conducted extensive studies. As a result, they have found that when surface treatment is performed on a surface of a treatment target using a surface treatment agent containing a silylation agent and a nitrogen-containing heterocyclic compound which does not include a silicon atom, the surface of the treatment target is highly hydrophobized. In addition, they have found that, by hydrophobizing the surface of an inorganic pattern or a resin pattern provided on a substrate by treating with such a surface treatment agent so as to increase the contact angle thereof with respect to a cleaning liquid, pattern collapse of the inorganic pattern or the resin pattern is prevented, thereby arriving at completion of the present invention. More specifically, the present invention provides the following.

A first aspect of the present invention is a surface treatment agent used in surface treatment of a treatment target, and including a silylation agent and a nitrogen-containing heterocyclic compound which does not include a silicon atom.

A second aspect of the present invention is a surface treatment method, and the method includes: exposing a surface of a treatment target to a surface treatment agent according to the first aspect; and treating the surface of the substrate.

The present invention provides a surface treatment agent capable of effectively preventing pattern collapse of an inorganic pattern or a resin pattern provided on a substrate, and a surface treatment method using such a surface treatment agent. In addition, the present invention provides a surface treatment agent capable of carrying out silylation treatment to a high degree on the surface of a treatment target, and a surface treatment method using such a surface treatment agent.

DETAILED DESCRIPTION OF THE INVENTION

Surface Treatment Agent

A surface treatment agent of the present invention will be explained. The surface treatment agent is used when silylating a surface of a treatment target. The types of the treatment target are not particularly limited. A preferable treatment target is a "substrate". Herein, as the "substrate", which is the target of silylation treatment, a substrate used for manufacturing semiconductor devices is exemplified; the "surface of the substrate" is exemplified by the surface of the substrate itself, as well as the surfaces of the inorganic pattern and resin pattern provided on the substrate, as well as the surfaces of an inorganic layer and an organic layer that have not been patterned.

Examples of the inorganic pattern provided on the substrate include a pattern that has been formed by producing an etching mask on the surface of an inorganic layer present on the substrate by way of a photoresist method, and subsequently performing an etching process. Examples of the inorganic layer other than the substrate itself include an oxide film of an element constituting the substrate, and a film or layer, etc. of inorganic matter such as silicon nitride, titanium nitride, and tungsten, and the like, formed on the surface of the substrate. Although such a film or layer is not particularly limited, a film or layer of inorganic matter, etc. that is formed in the manufacturing process of the semiconductor device is exemplified.

Examples of the resin pattern provided on the substrate include a resin pattern formed on the substrate by way of a photoresist method. Such a resin pattern is formed, for example, by forming an organic layer, which is a film of photoresist, on the substrate, exposing this organic layer through a photomask, and developing. As the organic layer, other than the surface of the substrate itself, a layer that is provided on the surface or the like of a laminated film provided on the surface of the substrate is exemplified. Although such an organic layer is not particularly limited, a film of organic matter provided in order to form an etching mask in the manufacturing process of a semiconductor device is exemplified.

The surface treatment can be performed by applying a surface treatment agent of solution type, to which a solvent has been added, on the surface of the treatment target such as the substrate by means of a spin-coating method, a dipping method, or the like.

The surface treatment agent of the present invention includes a silylation agent, and a nitrogen-containing heterocyclic compound which does not contain a silicon atom (hereinafter, also referred to as a "heterocyclic compound"). Each component thereof will be explained hereinafter.

Silylation Agent

First, a silylation agent used for the surface treatment agent of the present invention will be explained. The silylation agent used for the surface treatment agent of the present invention is a component for silylating a surface of a treatment target to increase the hydrophobicity of the surface of the treatment target. The silylation agent contained in the surface treatment agent of the present invention is not particularly limited, and any conventionally well-known silylation agent can be used. As such a silylation agent, for example, a silylation agent or a cyclic silazane compound having a substituent represented by the following general formula (2) can be used.

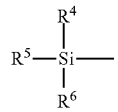
(2)

(In the above general formula (2), $R^4$, $R^5$ and $R^6$ each independently represents a hydrogen atom, a halogen atom, a nitrogen-containing group, or an organic group; and the total number of carbon atoms contained in $R^4$, $R^5$ and $R^6$ is at least 1.)

More specifically, as the silylation agent having a substituent represented by the above general formula (2), a silylation agent represented by the following general formulae (3) to (8) can be used.

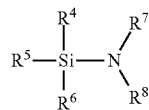
(3)

(In the above general formula (3), $R^4$, $R^5$, and $R^6$ are the same as in the above general formula (2); $R^7$ represents a hydrogen atom or a saturated or unsaturated alkyl group; and $R^8$ represents a hydrogen atom, a saturated or unsaturated alkyl group, a saturated or unsaturated cycloalkyl group, an acetyl group, or a saturated or unsaturated hetero-cycloalkyl group. $R^7$ and $R^8$ may bond together to form a ring structure including a nitrogen atom.)

[chem. 3]

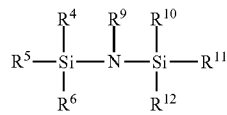
(4)

(In the above general formula (4), $R^4$, $R^5$ and $R^6$ are the same as in the above general formula (2); $R^9$ represents a hydrogen atom, a methyl group, a trimethylsilyl group, or a dimethylsilyl group; $R^{10}$, $R^{11}$ and $R^{12}$ each independently represent a hydrogen atom or an organic group; and the total number of carbon atoms contained in $R^{10}$, $R^{11}$ and $R^{12}$ is at least 1.)

[chem. 4]

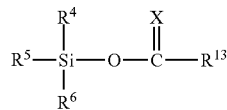
(5)

(In the above general formula (5), $R^4$, $R^5$ and $R^6$ are the same as in the above general formula (2); X represents O, $CHR^{14}$, $CHOR^{14}$, $CR^{14}R^{14}$, or $NR^{15}$; $R^{13}$ and $R^{14}$ each independently represent a hydrogen atom, a saturated or unsaturated alkyl group, a saturated or unsaturated cycloalkyl group, a trialkylsilyl group, a trialkylsiloxy group, an alkoxy group, a phenyl group, a phenylethyl group, or an acetyl group; and $R^{15}$ represents a hydrogen atom, an alkyl group, or a trialkylsilyl group.)

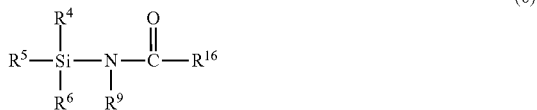

(In the above general formula (6), $R^4$, $R^5$ and $R^6$ are the same as in the above general formula (2); $R^9$ is the same as in the above general formula (4); and $R^{16}$ represents a hydrogen atom, a saturated or unsaturated alkyl group, a trifluoromethyl group, or a trialkylsilyl amino group.)

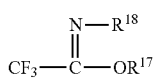

(In the above general formula (7), $R^{17}$ and $R^{18}$ each independently represent a hydrogen atom, an alkyl group, or a trialkylsilyl group; and at least one of $R^{17}$ and $R^{18}$ represents a trialkylsilyl group.)

(In the above general formula (8), $R^{19}$ represents a trialkylsilyl group; and $R^{20}$ and $R^{21}$ each independently represent a hydrogen atom or an organic group.)

(In the above general formula (9), $R^4$, $R^5$ and $R^6$ are the same as in the above general formula (2); $R^{22}$ represents an organic group; and $R^{23}$ is not present or represents —$SiR^{24}R^{25}R^{26}$ if present. $R^{24}$, $R^{25}$ and $R^{26}$ each independently represent a hydrogen atom, a halogen atom, a nitrogen-containing group or an organic group; and any one of $R^{24}$, $R^{25}$ and $R^{26}$ may bond with any one of $R^4$, $R^5$ and $R^6$ through a nitrogen atom to form an imino group.)

Examples of the silylation agent represented by the above general formula (3) include (N,N-dimethylamino)trimethylsilane, (N,N-dimethylamino)dimethylsilane, (N,N-dimethylamino)monomethylsilane, (N,N-diethylamino)trimethylsilane, tert-butylaminotrimethylsilane, (alylamino)trimethylsilane, (trimethylsilyl)acetamide, (N—N-dimethylamino)dimethylvinylsilane, (N,N-dimethylamino)dimethylpropylsilane, (N,N-dimethylamino)dimethyloctylsilane, (N,N-dimethylamino)dimethylphenylethylsilane, (N,N-dimethylamino)dimethylphenylsilane, (N,N-dimethylamino)dimethyl-tert-butylsilane, (N,N-dimethylamino)triethylsilane, trimethylsilanamine, monomethyl silyl imidazole, dimethylsilyl imidazole, trimethylsilyl imidazole, monomethyl silyl triazole, dimethylsilyl triazole, trimethylsilyl triazole, and the like.

Examples of the silylation agent represented by the above general formula (4) include hexamethyl disilazane, N-methyl-hexamethyl disilazane, 1,1,3,3-tetramethyl disilazane, 1,3-dimethyl disilazane, 1,2-di-N-octyltetramethyl disilazane, 1,2-divinyltetramethyl disilazane, heptamethyl disilazane, nonamethyl trisilazane, tris(dimethylsilyl)amine, tris(trimethylsilyl)amine, pentamethylethyl disilazane, pentamethylvinyl disilazane, pentamethylpropyl disilazane, pentamethylphenylethyl disilazane, pentamethyl-tert-butyl disilazane, pentamethylphenyl disilazane, trimethyltriethyl disilazane, and the like.

Examples of the silylation agent represented by the above general formula (5) include trimethylsilyl acetate, dimethylsilyl acetate, monomethylsilyl acetate, trimethylsilyl propionate, trimethylsilyl butyrate, trimethylsilyloxy-3-pentene-2-one, and the like.

Examples of the silylation agent represented by the above general formula (6) include bis(trimethylsilyl)urea, N-trimethylsilyl acetamide, N-methyl-N-(trimethylsilyl)trifluoroacetamide, and the like.

Examples of the compounds represented by the above general formula (7) include bis(trimethylsilyl)trifluoroacetamide and the like; and examples of the compound represented by the above general formula (8) include 2-trimethylsiloxypenta-2-en-4-one and the like. Examples of the compounds represented by the above general formula (9) include 1,2-bis(chlorodimethylsilyl)ethane, tert-butyldimethylsilyl chloride, and the like.

Examples of the cyclic silazane compound include a cyclic disilazane compound such as 2,2,5,5-tetramethyl-2,5-disila-1-aza-cyclopentane and 2,2,6,6-tetramethyl-2,6-disila-1-aza-cyclohexane; a cyclic trisilazane compound such as 2,2,4,4,6,6-hexamethylcyclotrisilazane and 2,4,6-trimethyl-2,4,6-trivinylcyclotrisilazane; a cyclic tetrasilazane compound such as 2,2,4,4,6,6,8,8-octamethylcyclotetrasilazane; and the like.

Herein, if focusing on a substituent bonding to a silicon atom, it is preferable to use a silylation agent in which a so-called bulky substituent having a large number of carbon atoms contained in the substituent bonds to the silicon atom. When the surface treatment agent contains such a silylation agent, the hydrophobicity of the surface of the treatment target that has received treatment by this surface treatment agent can be increased. When the treatment target is a substrate, it is possible to improve the adhesion between the surface of the substrate that has received treatment and the resin pattern. In addition, as will be explained later, among the surfaces of the substrate that have received treatment, pattern collapse of an inorganic pattern or a resin pattern can be prevented by increasing the hydrophobicity of the surface of the inorganic pattern and the resin pattern in particular.

Consequently, in the above general formula (2), the total number of carbon atoms contained in $R^4$, $R^5$ and $R^6$ is preferably at least 3. Especially, from the viewpoint of obtaining sufficient reactivity in the silylation reaction, it is preferable that any one of $R^4$, $R^5$ and $R^6$ in the above general formula (2) is an organic group having at least 2 carbon atoms (hereinafter, referred to as a "specific organic group" in this paragraph), and the remaining two each independently is a methyl group or an ethyl group. As the specific organic group, an alkyl group having 2 to 20 carbon atoms that may have a branch and/or substituent, a vinyl group that may have a substituent, an aryl group that may have a substituent, and the like, are exemplified. The number of carbon atoms of the specific organic group is preferably 2 to 12, more preferably 2 to 10, and particularly preferably 2 to 8.

From such a viewpoint, among the silylation agents exemplified above, (N—N-dimethylamino)dimethylvinylsilane, (N,N-dimethylamino)dimethylpropylsilane, (N,N-dimethylamino)dimethyloctyl silane, (N,N-dimethylamino)dimethylphenylethylsilane, (N,N-dimethylamino)dimethylphenylsilane, (N,N-dimethylamino)dimethyl-tert-butylsilane, (N,N-dimethylamino)triethylsilane, N,N-dimethylamino trimethylsilane, pentamethylethyl disilazane, pentalmethylvinyl disilazane, pentamethylpropyl disilazane, pentamethylphenylethyl disilazane, pentamethyl-tert-butyl disilazane, pentamethylphenyl disilazane, trimethyltriethyl disilazane, and the like, are preferably exemplified.

The silylation agents exemplified above can be used alone or by mixing at least 2 thereof.

Heterocyclic Compound

A surface treatment agent includes a nitrogen-containing heterocyclic compound which does not include a silicon atom (also simply referred to as a "heterocyclic compound").

Conventionally, in silylation of the surface of a treatment target such as a substrate, for example, when a silylation agent is hexamethyl disilazane (HMDS), a long time may have been required in the silylation reaction, and sufficient hydrophobicity of the surface of the treatment target may not have been obtained, because of insufficient reactivity of the silylation agent.

However, when the surface treatment agent includes a silylation agent and a nitrogen-containing heterocyclic compound which does not include a silicon atom, the silylation reaction by the silylation agent is promoted by a catalyst effect by a nitrogen-containing heterocyclic compound, and the surface of the treatment target is highly hydrophobized. Consequently, when the surface of the treatment target is subjected to silylation treatment using the surface treatment agent of the present invention, the surface of the treatment target can be highly hydrophobized. Furthermore, when the surface of the treatment target is hydrophobized using the surface treatment agent of the present invention, to the same extent as in conventional cases, it is possible to shorten the time required for surface treatment.

The heterocyclic compound is not particularly limited, and any compound which does not include a silicon atom and which includes a nitrogen atom in the ring structure thereof can be used. The heterocyclic compound may include, for example, an oxygen atom and a sulfur atom, that is, a hetero atom other than a nitrogen atom, in the ring thereof. It is preferable that the heterocyclic compound is a compound including a nitrogen-containing heterocycle having an aromatic property. When the heterocyclic compound includes a nitrogen-containing heterocycle having an aromatic property, it is possible to increase the hydrophobicity of the surface of the treatment target that has been treated with a surface treatment agent.

The heterocyclic compound may be a compound in which two or more rings are bonded by a single bond, or a compound bonded by bi- or poly-valent linking group. In this case, two or more rings bonded by a linking group are only required to include at least one nitrogen-containing heterocycle. In the poly-valent linking group, divalent linking groups are preferable from the viewpoint that the steric hindrance between rings is small. Specific examples of the divalent linking group include an alkylene group having 1 to 6 carbon atoms, —CO—, —CS—, —O—, —S—, —NH—, —N=N—, —CO—O—, —CO—NH—, —CO—S—, —CS—O—, —CS—S—, —CO—NH—CO—, —NH—CO—NH—, —SO—, —SO$_2$—, and the like. The number of rings included in the compound in which two or more rings are bonded by the poly-valent linking group is preferably 4 or less, more preferably 3 or less, and the most preferably 2 from the viewpoint of easiness in preparing a uniform surface treatment agent. Note here that, in, for example, a condensed ring such as a naphthalene ring, the number of rings is 2.

The heterocyclic compound may be a nitrogen-containing heterocyclic compound in which two or more rings are condensed. In this case, at least one ring among the rings constituting the condensed ring is only required to be a nitrogen-containing heterocycle. The number of rings included in the nitrogen-containing heterocyclic compound in which two or more rings are condensed is preferably 4 or less, more preferably 3 or less, and the most preferably 2 from the viewpoint of easiness in preparing a uniform surface treatment agent.

From the viewpoint that an effect of the surface treatment using a surface treatment agent is excellent, the heterocyclic compound preferably includes a condensed polycyclic including a nitrogen-containing five-membered ring or a nitrogen-containing five-membered ring skeleton.

Preferable examples of the heterocyclic compound include pyridine, pyridazine, pyrazine, pyrimidine, triazine, tetrazine, pyrrole, pyrazole, imidazole, triazole, tetrazole, oxazole, isoxazole, thiazole, isothiazole, oxadiazole, thiadiazole, quinoline, isoquinoline, cinnoline, phthalazine, quinoxaline, quinazoline, indole, indazole, benzimidazole, benzotriazole, benzoxazole, benzisoxazole, benzothiazole, benzoisothiazole, benzoxadiazole, benzothiadiazole, saccharin, pyrrolidine, and, piperidine. Among these, pyrrole, pyrazole, imidazole, triazole, tetrazole, oxazole, isoxazole, thiazole, isothiazole, oxadiazole, thiadiazole, indole, indazole, benzimidazole, benzotriazole, benzoxazole, benzoisoxazole, benzothiazole, benzoisothiazole, benzoxadiazole, benzothiadiazole, and saccharin are preferable, and imidazole, triazole, tetrazole, benzotriazole, and pyrazole are more preferable. The above-mentioned heterocyclic compound having a substituent is also preferably used.

Examples of the substituents which the heterocyclic compound may have include an alkyl group having 1 to 6 carbon atoms, a cycloalkyl group having 3 to 8 carbon atoms, an alkoxy group having 1 to 6 carbon atoms, a cycloalkyloxy group having 3 to 8 carbon atoms, an aryl group having 6 to 20 carbon atoms, an aralkyl group having 7 to 20 carbon atoms, an alkyl halide group having 1 to 6 carbon atoms, an aliphatic acyl group having 2 to 7 carbon atoms, an aliphatic acyl halide group having 2 to 7 carbon atoms, an aryl carbonyl group having 7 to 20 carbon atoms, a carboxyalkyl group having 2 to 7 carbon atoms, a halogen atom, a hydroxyl group, a mercapto group, an alkylthio group having 1 to 6 carbon atoms, an amino group, a monoalkyl amino group including an alkyl group having 1 to 6 carbon atoms, a dialkyl amino group including an alkyl group having 1 to 6 carbon atoms, a nitro group, a cyano group, and the like. The heterocyclic compound may have a plurality of substituents on the heterocycle thereof. When a plurality of substituents are included, the plurality of substituents may be the same as or different from each other. When these substituents include an aliphatic hydrocarbon ring, an aromatic hydrocarbon ring, or the like, these rings may further include the same substituents as the substituents which the heterocyclic compound may have.

The number of carbon atoms of the alkyl group as a substituent is 1 to 6, preferably 1 to 4, and more preferably 1 or 2. Specific examples of the alkyl group having 1 to 6 carbon atoms include a methyl group, an ethyl group, an n-propyl group, an isopropyl group, an n-butyl group, an isobutyl group, a sec-butyl group, a tert-butyl group, an n-pentyl group, an n-hexyl group, and the like. Among these, a methyl group and an ethyl group are preferable, and a methyl group is more preferable.

The number of carbon atoms of the cycloalkyl group as a substituent is 3 to 8, preferably 3 to 7, and more preferably 4 to 6. Specific examples of the cycloalkyl group having 3 to 8 carbon atoms include a cyclopropyl group, a cyclobutyl group, a cyclopentyl group, a cyclohexyl group, and a cycloheptyl group, and a cyclooctyl group.

The number of carbon atoms of the alkoxy group as a substituent is 1 to 6, preferably 1 to 4, and more preferably 1 or 2. Specific examples of the alkoxy group having 1 to 6 carbon atoms include a methoxy group, an ethoxy group, an n-propyloxy group, an isopropyloxy group, an n-butyloxy group, an isobutyloxy group, a sec-butyloxy group, a tert-butyloxy group, an n-pentyloxy group, an n-hexyloxy group, and the like. Among these, a methoxy group and an ethoxy group are preferable, and a methoxy group is more preferable.

The number of carbon atoms of the cycloalkyloxy group as a substituent is 3 to 8, preferably 3 to 7, and more preferably 4 to 6. Specific examples of the cycloalkyloxy group having 3 to 8 carbon atoms include a cyclopropyloxy group, cyclobutyloxy group, a cyclopentyloxy group, a cyclohexyloxy group, a cycloheptyloxy group, and a cyclooctyloxy group.

The number of carbon atoms of the aryl group as a substituent is 6 to 20, and preferably 6 to 12. Specific examples of the aryl group having 6 to 20 carbon atoms include a phenyl group, α-naphthyl group, a β-naphthyl group, a biphenyl-4-yl group, a biphenyl-3-yl group, a biphenyl-2-yl group, an anthracene-1-yl group, an anthracene-2-yl group, an anthracene-9-yl group, a phenanthrene-1-yl group, a phenanthrene-2-yl group, a phenanthrene-3-yl group, a phenanthrene-4-yl group, and a phenanthrene-9-yl group. Among these, a phenyl group, an α-naphthyl group, a β-naphthyl group, a biphenyl-4-yl group, a biphenyl-3-yl group, and a biphenyl-2-yl group are preferable, and a phenyl group is more preferable.

The number of carbon atoms of the aralkyl group as a substituent is 7 to 20, and preferably 7 to 12. Specific examples of the aralkyl group having 7 to 20 carbon atoms include a benzyl group, a phenethyl group, a 3-phenyl-n-propyl group, a 4-phenyl-n-butyl group, an α-naphthyl methyl group, a β-naphthyl methyl group, a 2-(α-naphthyl) ethyl group, and a 2-(β-naphthyl)ethyl group. Among these groups, a benzyl group and a phenethyl group are preferable, and a benzyl group is more preferable.

Examples of the halogen atom included in an alkyl halide group as a substituent include a fluorine atom, a chlorine atom, a bromine atom, and an iodine atom. The number of carbon atoms of the alkyl halide group as a substituent is 1 to 6, preferably 1 to 4, and more preferably 1 or 2. Specific examples of the alkyl halide group having 1 to 6 carbon atoms include a chloromethyl group, a dichloromethyl group, a trichloromethyl group, a fluoromethyl group, a difluoromethyl group, a trifluoromethyl group, a 1,1-difluoroethyl group, a 2,2,2-trifluoroethyl group, and a pentafluoroethyl group.

The number of carbon atoms of the aliphatic acyl group as a substituent is 2 to 7, preferably 2 to 5, and more preferably 2 or 3. Specific examples of the aliphatic acyl group having 2 to 7 carbon atoms include an acetyl group, a propionyl group, a butanoyl group, a pentanoyl group, a hexanoyl group, and a heptanoyl group. Among these, an acetyl group and a propionyl group are preferable, and an acetyl group is more preferable.

Examples of the halogen atom included in the aliphatic acyl halide group as a substituent including a fluorine atom, a chlorine atom, a bromine atom, and an iodine atom. The number of carbon atoms of the aliphatic acyl halide group as a substituent is 2 to 7, preferably 2 to 5, and more preferably 1 or 2. Specific examples of the aliphatic acyl halide group having 2 to 7 carbon atoms include a chloroacetyl group, a dichloroacetyl group, a trichloroacetyl group, a fluoroacetyl group, a difluoroacetyl group, a trifluoroacetyl group, and a pentafluoropropionyl group.

The number of carbon atoms of the aryl carbonyl group as a substituent is 7 to 20, and preferably 7 to 13. Specific examples of the aryl carbonyl group having 7 to 20 carbon atoms include a benzoyl group, an α-naphthoyl group, and a β-naphthoyl group.

The number of carbon atoms of the carboxyalkyl group as a substituent is 2 to 7, preferably 2 to 5, and more preferably 2 or 3. Specific examples of the carboxyalkyl group having 2 to 7 carbon atoms include a carboxymethyl group, a 2-carboxyethyl group, a 3-carboxy-n-propyl group, a 4-carboxy-n-butyl group, a 5-carboxy-n-pentyl group, and a 6-carboxy-n-hexyl group. Among these, a carboxymethyl group is preferable.

Examples of the halogen atom include a fluorine atom, a chlorine atom, a bromine atom, and an iodine atom. Among these, a fluorine atom, a chlorine atom, and a bromine atom are preferable, and a chlorine atom and a bromine atom are more preferable.

The number of carbon atoms of the alkylthio group as a substituent is 1 to 6, preferably 1 to 4, and more preferably 1 or 2. Specific examples of the alkylthio group having 1 to 6 carbon atoms include a methylthio group, an ethylthio group, an n-propylthio group, an isopropylthio group, an n-butylthio group, an isobutylthio group, a sec-butylthio group, a tert-butylthio group, an n-pentylthio group, an n-hexylthio group, and the like. Among these, a methylthio group and an ethylthio group are preferable, and a methylthio group is more preferable.

Specific examples of alkyl groups included in the monoalkyl amino group including an alkyl group having 1 to 6 carbon atoms, and in the dialkyl amino group including the alkyl group having 1 to 6 carbon atoms are similar to the above-mentioned specific examples of the alkyl group as the substituent. As the monoalkyl amino group including an alkyl group having 1 to 6 carbon atoms, an ethyl amino group and a methyl amino group are preferable, and a methyl amino group is more preferable. As the dialkyl amino group including an alkyl group having 1 to 6 carbon atoms, a diethyl amino group and a dimethyl amino group are preferable, and a dimethyl amino group is more preferable.

Particularly preferable examples of the heterocyclic compound include a compound represented by the following formula.

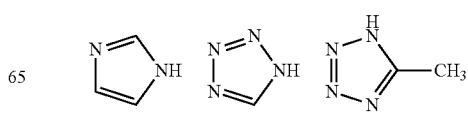

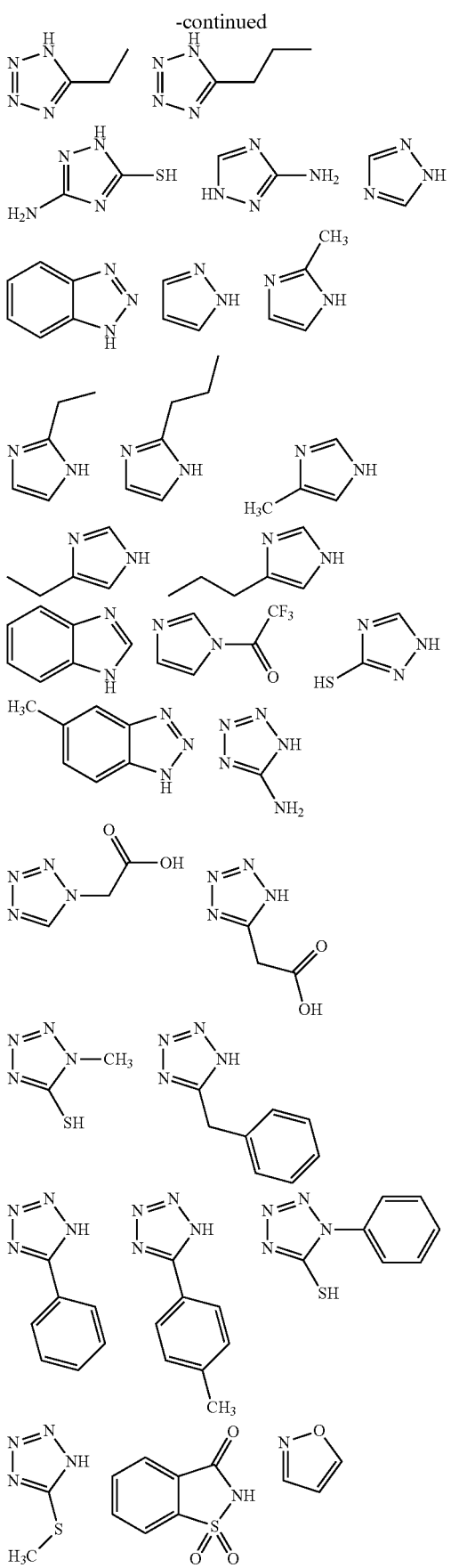

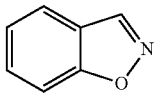

An amount of the heterocyclic compound added in the surface treatment agent is not particularly limited within the scope in which the object of the present invention is not hindered. An amount of the heterocyclic compound added in the surface treatment agent is preferably 0.1 to 20 moles, more preferably 0.2 to 10 moles, and the most preferably 0.5 to 5 moles relative to 1 mole of the above-mentioned silylation agent. The amount of the heterocyclic compound added within the above-mentioned range promotes the silylation reaction by the surface treatment agent, and easily improves hydrophobicity of the surface of the treatment target as a subject to be treated.

Solvent

A surface treatment agent may contain a solvent. When the surface treatment agent contains a solvent, surface treatment of a treatment target by way of a spin-coating method, a dipping method, or the like, becomes easy. Next, solvents which can be contained in the surface treatment agent will be described.

A solvent is not particularly limited and any conventionally well-known solvents capable of dissolving a silylation agent and a heterocyclic compound and giving less damage to the surface of the treatment target (for example, the surface of the substrate (inorganic pattern, resin pattern, and the like)) can be used.

Specific examples thereof include:

sulfoxides such as dimethylsulfoxide;

sulfones such as dimethylsulfone, diethylsulfone, bis(2-hydroxyethyl)sulfone, and tetramethylene sulfone;

amides such as N,N-dimethylformamide, N-methylformamide, N,N-dimethylacetamide, N-methylacetamide, and N,N-dimethylacetamide; lactams such as N-methyl-2-pyrrolidone, N-ethyl-2-pyrrolidone, N-propyl-2-pyrrolidone, N-hydroxymethyl-2-pyrrolidone, and N-hydroxyethyl-2-pyrrolidone;

imidazolidinones such as 1,3-dimethyl-2-imidazolidinone, 1,3-diethyl-2-imidazolidinone, and 1,3-diisopropyl-2-imidazolidinone;

dialkyl glycol ethers such as dimethyl glycol, dimethyl diglycol, dimethyl trigylcol, methylethyl diglycol, diethyl glycol, and triethylene glycol butyl methyl ether;

(poly)alkylene glycol monoalkyl ethers such as ethylene glycol monomethyl ether, ethylene glycol monoethyl ether, ethylene glycol mono-n-propyl ether, ethylene glycol mono-n-butyl ether, diethylene glycol monomethyl ether, diethylene glycol monoethyl ether, diethylene glycol mono-n-propyl ether, diethylene glycol mono-n-butyl ether, triethylene glycol monomethyl ether, triethylene glycol monoethyl ether, propylene glycol monomethyl ether, propylene glycol monoethyl ether, propylene glycol mono-n-propyl ether, propylene glycol mono-n-butyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether, and tripropylene glycol monoethyl ether;

(poly)alkylene glycol monoalkyl ether acetates such as ethylene glycol monomethyl ether acetate, ethylene glycol monoethyl ether acetate, ethylene glycol monobutyl ether acetate, diethylene glycol monomethyl ether acetate, diethylene glycol monoethyl ether acetate, propylene glycol monomethyl ether acetate and propylene glycol monoethyl ether acetate;

other ethers such as dimethyl ether, diethyl ether, methylethyl ether, dipropyl ether, diisopropyl ether, dibutyl ether, diisoamyl ether, diethylene glycol dimethyl ether, diethylene glycol methylethyl ether, diethylene glycol diethyl ether, tetraethylene glycol dimethyl ether, and tetrahydrofuran;

ketones such as methyl ethyl ketone, cyclohexanone, 2-heptanone, and 3-heptanone;

alkyl lactate esters such as methyl 2-hydroxypropionate and ethyl 2-hydroxypropionate; other esters such as 2-hydroxy-2-methylpropionic acid ethyl, 3-methoxypropionic acid methyl, 3-methoxypropionic acid ethyl, 3-ethoxypropionic acid methyl, 3-ethoxypropionic acid ethyl, ethoxyacetic acid ethyl, hydroxyacetic acid ethyl, 2-hydroxy-3-methylbutanoic acid methyl, 3-methoxy butyl acetate, 3-methyl-3-methoxybutyl acetate, 3-methyl-3-methoxybutyl propionate, ethyl acetate, n-propyl acetate, i-propyl acetate, n-butyl acetate, i-butyl acetate, n-pentyl acetate, n-hexyl acetate, n-heptyl acetate, n-octyl acetate, n-pentyl formate, i-pentyl acetate, n-butyl propionate, ethyl butyrate, n-propyl butyrate, i-propyl butyrate, n-butyl butyrate, methyl n-octanoate, methyl decanoate, methyl pyruvate, ethyl pyruvate, n-propyl pyruvate, methyl acetoacetate, ethyl acetoacetate, ethyl 2-oxobutanoate, dimethyl adipate, and propylene glycol diacetate; lactones such as β-propiolactone, γ-butyrolactone, and δ-pentyrolactone;

straight-chain, branched chain, or cyclic aliphatic hydrocarbons such as n-hexane, n-heptane, n-octane, n-nonane, methyloctane, n-decane, n-undecane, n-dodecane, 2,2,4,6,6-pentamethyl heptane, 2,2,4,4,6,8,8-heptamethyl nonane, cyclohexane, and methyl cyclohexane;

aromatic hydrocarbons such as benzene, toluene, xylene, 1,3,5-trimethyl benzene, and naphthalene;

terpenes such as p-menthane, diphenyl menthane, limonene, terpinene, bornane, norbornane and pinane; and the like.

These solvents can be used alone or by mixing at least two thereof.

Note here that when a non-polar solvent is used, a heterocyclic compound is slightly less easily dissolved, and a surface treatment agent may include crystals of the heterocyclic compound. In a case in which it is necessary to use a non-polar solvent in the surface treatment agent due to the relationship with a subsequent step of the surface treatment by the surface treatment agent, after having performed the surface treatment using the surface treatment agent, it is preferable to provide a step of removing crystals of the heterocyclic compound that have precipitated, as necessary.

In addition, in a case in which a subject to be treated with the surface treatment agent of the present invention is an organic material such as a resin pattern, an ether-based solvent having 2 to 14 carbon atoms is preferably used, and an ether-based solvent having 3 to 12 carbon atoms is more preferably used, from the viewpoint of being able to reduce the damage to the subject to be treated. Specific examples of such ether-based solvents include an alkyl ether such as dimethyl ether, diethyl ether, methylethyl ether, dipropyl ether, diisopropyl ether, and dibutyl ether and diisoamyl ether. Among these, diisopropyl ether, dibutyl ether and diisoamyl ether are preferred. The above-mentioned ether-based solvents can be used alone or in combination of at least two thereof.

In a case of allowing a solvent to be contained in the surface treatment agent of the present invention, the total concentration of the silylation agent and the heterocyclic compound included in the surface treatment agent is practically preferably 0.1% by mass or more, more preferably 0.1 to 30% by mass, particularly preferably 0.5 to 20% by mass, and the most preferably 1 to 15% by mass.

Note here that the above-described surface treatment agent hardly causes elution of metal such as SUS even when it is brought into contact with the metal. For example, even when a test piece including iron is dipped in the surface treatment agent at room temperature for 5 days or more, elution of iron into the surface treatment agent is 3 ppb or less.

Surface Treatment Method

Next, a surface treatment method of the present invention will be explained. The surface treatment method of the present invention exposes a surface of a treatment target to the above-mentioned surface treatment agent of the present invention, and treats the surface of the treatment target.

When the treatment target is a substrate, as already explained, the surface of the substrate as a subject to be treated in the surface treatment method of the present invention indicates the surface of the substrate itself, the surface of an inorganic pattern and a resin pattern, as well as an inorganic layer and an organic layer, which are not patterned, provided on the substrate. Since explanations for the surface of the inorganic pattern and the resin pattern and the inorganic layer and the organic layer, which are not patterned, provided on the substrate are as already mentioned, the explanations are omitted herein.

The surface treatment method of the present invention performs silylation treatment on a surface of a treatment target, and the purpose of this treatment may not be limited, and a representative example of the purpose of this treatment is (1) to hydrophobize the surface of the treatment target such as a substrate so as to improve the adhesion to a resin pattern etc. composed of photoresist or the like, and (2) to prevent pattern collapse of an inorganic pattern or a resin pattern on the surface of the substrate during cleaning of the surface of the treatment target as the substrate.

For the above-mentioned purpose (1), as a method of exposing the surface of the treatment target to the above-mentioned surface treatment agent of the present invention, a conventional well-known method can be used without being particularly limited and, for example, a method of vaporizing the above-mentioned surface treatment agent of the present invention to form vapor and bringing this vapor into contact with the surface of the treatment target, a method of bringing the above-mentioned surface treatment agent of the present invention into contact with the surface of the treatment target by a spin-coating method, a dipping method, etc. can be exemplified. When a substrate to be used for formation of an organic layer as a film of photoresist is a treatment target, the surface treatment agent should be exposed, prior to formation of the organic layer. By such an operation, the surface of the treatment target is silylated, and the hydrophobicity of the surface of the treatment target is improved. When the treatment target is a substrate, and when a substrate which has been treated with the surface treatment agent is used, the surface of the substrate is hydrophobized, thereby improving the adhesion of the substrate with respect to, for example, photoresist or the like.

For the above-mentioned purpose (2), prior to performing a cleaning operation after forming an inorganic pattern or a resin pattern, the surface as the treatment target of the substrate may be exposed to the above-mentioned surface treatment agent of the present invention. Next, the reason why pattern collapse of an inorganic pattern or a resin pattern on the surface of a substrate can be prevented during the cleaning of the surface of the substrate by conducting such a surface treatment will be explained.

Usually, after an inorganic pattern has been formed on the surface of a substrate, the surface of the pattern is generally cleaned using a cleaning liquid such as SPM (sulfuric acid/hydrogen peroxide solution) and APM (ammonia/hydrogen peroxide solution). In addition, after a resin pattern has been formed on the surface of a substrate, developing residue and adhering developing solution are generally cleaned and removed using a cleaning liquid such as water and an activator rinse. In the surface treatment method of the present invention, prior to cleaning such an inorganic pattern or a resin pattern, the pattern surface is treated with the above-mentioned surface treatment agent of the present invention, and the surface of the pattern is hydrophobized.

Herein, the force F acting between the patterns of the inorganic pattern and resin pattern during cleaning is represented as in the following formula (I). In the formula, $\gamma$ represents surface tension of the cleaning liquid, $\theta$ represents a contact angle of the cleaning liquid, A represents an aspect ratio of the pattern, and D represents a distance between the pattern side walls.

$$F = 2\gamma \cdot \cos\theta \cdot A/D \quad (I)$$

Therefore, if the surface of the pattern can be hydrophobized and the contact angle of the cleaning liquid can be increased (or cos $\theta$ can be reduced), the force acting between the patterns during the following cleaning can be reduced, and thus the pattern collapse can be prevented.

This surface treatment is performed by dipping the substrate, on which an inorganic pattern or a resin pattern has been formed, in the surface treatment agent, or by applying or spraying the surface treatment agent on the inorganic pattern or the resin pattern. The treatment time is preferably 1 to 60 seconds. In addition, after this surface treatment, the contact angle of water on the pattern surface preferably becomes 40 to 120 degrees, and more preferably becomes 60 to 100 degrees.

When the above-mentioned surface treatment has finished, the inorganic pattern or the resin pattern is cleaned. In this cleaning process, cleaning liquids that have been conventionally used in cleaning processes of inorganic patterns and resin patterns can be employed without modification for this cleaning process. For example, SPM, APM, and the like, can be exemplified for the inorganic pattern, and water, activator rinse, and the like, can be exemplified for the resin pattern.

Note here that the surface treatment and the cleaning process are preferably continuous processes from the viewpoint of throughput. As a result, for the surface treatment agent, it is preferable to select a liquid that is excellent in displaceability with the cleaning liquid.

The surface treatment agent to be used for the surface treatment method of the present invention contains a silylation agent and a nitrogen-containing heterocyclic compound which does not include a silicon atom, as described in the above-mentioned surface treatment agent of the present invention, and this nitrogen-containing heterocyclic compound which does not include a silicon atom is a compound functioning as a catalyst for silylating the surface of the treatment target. Consequently, the surface of the treatment target, which has been treated with the surface treatment method of the present invention, is highly hydrophobized (silylated). When the treatment target is a substrate to be used for formation of a resin pattern or an inorganic pattern, as a result of the surface treatment, adhesion to the resin pattern or the like is improved, or pattern collapse is prevented.

EXAMPLES

Hereinafter, the present invention will be explained more specifically by way of Examples, but the present invention is not limited to the following Examples.

Examples 1 to 52 and Comparative Examples 1 to 8

In Examples and Comparative Examples, as a silylation agent, the following SA1 to SA3, SA4: 2,2,5,5-tetramethyl-2,5-disila-1-aza-cyclopentane, and SA5: 2,2,4,4,6,6-hexamethylcyclotrisilazane were used.

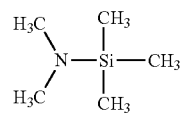

SA1

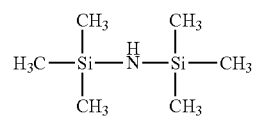

SA2

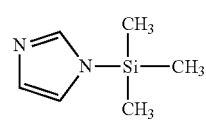

SA3

In Examples and Comparative Examples, as a nitrogen-containing heterocyclic compound which does not include a silicon atom, the following H1 to H8 were used.

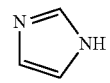

H1

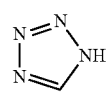

H2

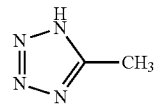

H3

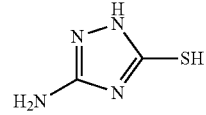

H4

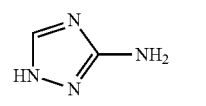

H5

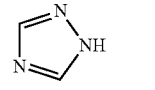

H6

-continued
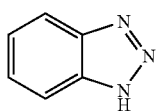 H7
 H8
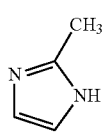 H9
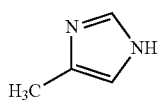 H10
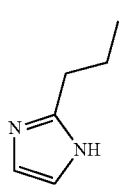 H11
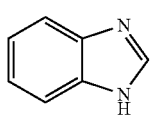 H12
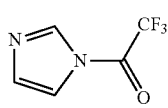 H13
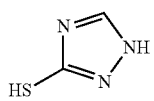 H14
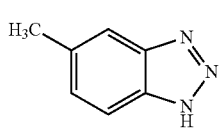 H15
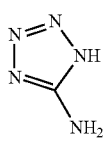 H16
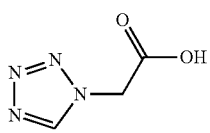 H17
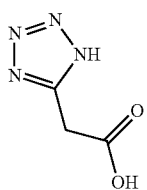 H18
-continued
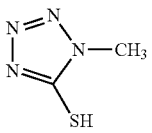 H19
 H20
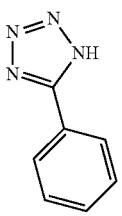 H21
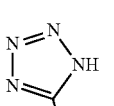 H22
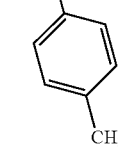 H23
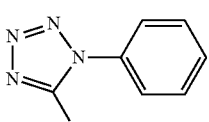 H24
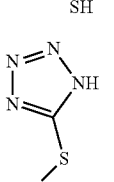 H25
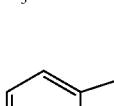 H26
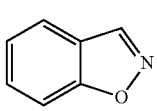 H27
In Examples and Comparative Examples, as a solvent, the following S1 to S15 were used.
S1: propylene glycol monomethyl ether acetate
S2: n-butyl acetate S3: ethyl acetate
S4: γ-butyrolactone
S5: high boiling-point solvent (triethylene glycol butyl methyl ether, boiling point: 261° C.)
S6: tetraethylene glycol dimethyl ether
S7: diethylene glycol diethyl ether
S8: 3-methoxy butyl acetate
S9: 3-methyl-3-methoxy butyl acetate
S10: ethylene glycol monobutyl ether acetate
S11: propylene glycol diacetate
S12: diethylene glycol monoethyl ether acetate
S12: dimethyl adipate
S13: methyl decanoate
S14: methyl n-octanoate
S15: n-octyl acetate Each silylation agent, each heterocyclic compound, and each solvent in types and amount (% by mass) described in Tables 1 to 3 were uniformly mixed with each other to obtain a surface treatment agent of each of Examples and Comparative Examples. Note here that some slight dissolving residues of the heterocyclic compound were generated in the surface treatment agents of Examples 15 to 19. By using the surface treatment agents obtained, a silicon substrate (Si), a silicon thermal oxide film substrate (thOx), and a silicon nitride substrate (SiN) were subjected to surface treatment according to the following method, and water contact angles after the surface treatment was measured. Measurement results of the water contact angles are shown in Table 1 to 3. The water contact angles were measured using Dropmaster 700 (Kyowa Interface Science Co., Ltd.) as follows: a droplet of pure water (1.8 μL) was dropped on a surface-treated surface of a substrate, and the contact angle 10 seconds after dropping was measured.

Surface Treatment Method

Firstly, a substrate was dipped in an HF aqueous solution having a concentration of 1% by mass at 25° C. for one minute. After dipping, the substrate was cleaned with ion-exchanged distilled water for one minute. The substrate after cleaning with water was dried by nitrogen flow. The dried substrate was dipped in the surface treatment agent of each Example and Comparative Example at 25° C. for 60 seconds to carry out the surface treatment of the substrate. The substrate after surface treatment was cleaned with isopropyl alcohol for one minute, and then cleaned with ion-exchanged distilled water for one minute. The cleaned substrate was dried by nitrogen flow so as to obtain a surface-treated substrate.

TABLE 1

| | Silylation agent | | Heterocyclic compounds | | Solvent | Mole ratio of silylation agent/ heterocyclic compound | Contact angle of water after surface treatment (°) | | |
|---|---|---|---|---|---|---|---|---|---|---|
| | Types | % by mass | Types | % by mass | Types | % by mass | | | | |
| Comp. Ex. 1 | SA1 | 1.46 | — | — | S1 | 98.54 | — | 80.5 | 77.7 | 61.7 |
| Ex. 1 | SA1 | 1.46 | H1 | 0.84 | S1 | 97.70 | 1.0 | 84.1 | 84.2 | 66.8 |
| Ex. 2 | SA1 | 1.46 | H1 | 4.20 | S1 | 94.34 | 0.2 | 86.2 | 89.0 | 68.1 |
| Ex. 3 | SA1 | 7.30 | H1 | 4.20 | S1 | 88.50 | 1.0 | 88.8 | 90.0 | 69.3 |
| Comp. Ex. 2 | SA2 | 2.00 | — | — | S1 | 98.00 | — | 62.2 | 14.4 | 28.4 |
| Ex. 4 | SA2 | 2.00 | H1 | 0.84 | S1 | 97.16 | 1.0 | 85.3 | 78.5 | 59.5 |
| Ex. 5 | SA2 | 2.00 | H1 | 4.20 | S1 | 93.80 | 0.2 | 88.2 | 90.7 | 66.7 |
| Ex. 6 | SA2 | 10.00 | H1 | 4.20 | S1 | 85.80 | 1.0 | 90.3 | 91.3 | 69.4 |
| Comp. Ex. 3 | SA3 | 1.74 | — | — | S1 | 98.26 | — | 80.4 | 77.6 | 64.5 |
| Ex. 7 | SA3 | 1.74 | H1 | 0.84 | S1 | 97.42 | 1.0 | 84.2 | 83.9 | 69.5 |
| Ex. 8 | SA3 | 1.74 | H1 | 4.20 | S1 | 94.06 | 0.2 | 85.8 | 87.8 | 66.5 |
| Ex. 9 | SA3 | 8.70 | H1 | 4.20 | S1 | 87.10 | 1.0 | 88.4 | 91.5 | 70.8 |
| Comp. Ex. 4 | SA1/ SA3 | 0.73/ 0.87 | — | — | S1 | 98.40 | — | 73.4 | 76.0 | 65.7 |
| Comp. Ex. 5 | SA2/ SA3 | 1.00/ 0.87 | — | — | S1 | 98.13 | — | 74.2 | 74.9 | 63.3 |
| Ex. 10 | SA2 | 10.00 | H1 | 4.20 | S2 | 85.80 | 1.0 | 84.5 | 91.3 | 68.3 |
| Ex. 11 | SA2 | 10.00 | H1 | 4.20 | S3 | 85.80 | 1.0 | 86.2 | 91.3 | 69.8 |
| Ex. 12 | SA2 | 10.00 | H1 | 4.20 | S4 | 85.80 | 1.0 | 83.3 | 87.7 | 69.3 |
| Ex. 13 | SA2 | 10.00 | H1 | 4.20 | S5 | 85.80 | 1.0 | 88.0 | 91.9 | 65.7 |
| Comp. Ex. 6 | SA2 | 10.00 | — | — | S1 | 90.00 | — | 53.1 | 46.0 | 37.1 |
| Ex. 14 | SA2 | 10.00 | H1 | 4.20 | S1 | 85.80 | 1.0 | 90.3 | 91.3 | 69.4 |
| Ex. 15 | SA2 | 10.00 | H2 | 1.00 | S1 | 89.00 | 4.3 | 92.7 | 92.8 | 75.4 |
| Ex. 16 | SA2 | 10.00 | H3 | 1.00 | S1 | 89.00 | 5.2 | 92.3 | 93.3 | 78.2 |
| Ex. 17 | SA2 | 10.00 | H4 | 1.00 | S1 | 89.00 | 7.2 | 82.7 | 79.7 | 70.0 |
| Ex. 18 | SA2 | 10.00 | H5 | 1.00 | S1 | 89.00 | 5.2 | 74.6 | 72.4 | 60.0 |
| Ex. 19 | SA2 | 10.00 | H6 | 1.00 | S1 | 89.00 | 4.3 | 91.2 | 91.9 | 78.1 |
| Ex. 20 | SA2 | 10.00 | H7 | 7.40 | S1 | 82.60 | 1.0 | 90.5 | 93.2 | 80.1 |
| Ex. 21 | SA2 | 10.00 | H8 | 4.20 | S1 | 85.80 | 1.0 | 80.3 | 80.4 | 68.6 |

TABLE 2

| | Silylation agent | | Heterocyclic compounds | | Solvent | | Mole ratio of silylation agent/ heterocyclic compound | Contact angle of water after surface treatment (°) | | |
|---|---|---|---|---|---|---|---|---|---|---|
| | Types | % by mass | Types | % by mass | Types | % by mass | | Si | thOx | SiN |
| Comp. Ex. 7 | SA4 | 10.00 | — | — | S1 | 90.00 | — | 81.8 | 71.2 | 44.4 |
| Ex. 22 | SA4 | 10.00 | H1 | 4.27 | S1 | 85.73 | 1.0 | 90.8 | 90.5 | 87.5 |
| Comp. Ex. 8 | SA5 | 2.00 | — | — | S1 | 98.00 | — | 64.1 | 16.1 | 32.5 |
| Ex. 23 | SA5 | 2.00 | H1 | 1.00 | S1 | 97.00 | 0.6 | 72.9 | 72.1 | 59.0 |
| Ex. 24 | SA2 | 2.00 | H1 | 0.84 | S6 | 97.16 | 1.0 | 85.0 | 80.1 | 62.1 |
| Ex. 25 | SA2 | 2.00 | H1 | 0.84 | S7 | 97.16 | 1.0 | 83.2 | 79.5 | 59.3 |
| Ex. 26 | SA2 | 2.00 | H1 | 0.84 | S8 | 97.16 | 1.0 | 86.0 | 81.2 | 60.5 |
| Ex. 27 | SA2 | 2.00 | H1 | 0.84 | S9 | 97.16 | 1.0 | 86.2 | 82.0 | 58.5 |
| Ex. 28 | SA2 | 2.00 | H1 | 0.84 | S10 | 97.16 | 1.0 | 83.6 | 80.5 | 58.9 |
| Ex. 29 | SA2 | 2.00 | H1 | 0.84 | S11 | 97.16 | 1.0 | 85.2 | 82.5 | 60.3 |
| Ex. 30 | SA2 | 2.00 | H1 | 0.84 | S12 | 97.16 | 1.0 | 86.6 | 80.9 | 62.3 |
| Ex. 31 | SA2 | 2.00 | H1 | 0.84 | S13 | 97.16 | 1.0 | 85.0 | 80.5 | 64.0 |
| Ex. 32 | SA2 | 2.00 | H1 | 0.84 | S14 | 97.16 | 1.0 | 86.4 | 82.1 | 63.3 |
| Ex. 33 | SA2 | 2.00 | H1 | 0.84 | S15 | 97.16 | 1.0 | 84.4 | 83.0 | 60.0 |

TABLE 3

| | Silylation agent | | Heterocyclic compounds | | Solvent | | Mole ratio of silylation agent/ heterocyclic compound | Contact angle of water after surface treatment (°) | | |
|---|---|---|---|---|---|---|---|---|---|---|
| | Types | % by mass | Types | % by mass | Types | % by mass | | Types | % by mass | Types |
| Comp. Ex. 6 | SA2 | 10.00 | — | — | S1 | 90.00 | — | 53.1 | 46.0 | 37.1 |
| Ex. 34 | SA2 | 10.00 | H9 | 1.00 | S1 | 89.00 | 5.1 | 75.8 | 70.4 | 52.3 |
| Ex. 35 | SA2 | 10.00 | H10 | 5.08 | S1 | 84.92 | 1.0 | 83.0 | 81.2 | 71.7 |
| Ex. 36 | SA2 | 10.00 | H11 | 6.82 | S1 | 83.18 | 1.0 | 70.6 | 68.2 | 41.1 |
| Ex. 37 | SA2 | 10.00 | H12 | 1.00 | S1 | 89.00 | 7.3 | 73.2 | 75.6 | 53.4 |
| Ex. 38 | SA2 | 10.00 | H13 | 10.10 | S1 | 79.90 | 1.0 | 82.2 | 80.4 | 69.6 |
| Ex. 39 | SA2 | 10.00 | H14 | 1.00 | S1 | 89.00 | 6.3 | 83.5 | 82.4 | 71.8 |
| Ex. 40 | SA2 | 10.00 | H15 | 8.25 | S1 | 81.75 | 1.0 | 88.2 | 89.6 | 78.7 |
| Ex. 41 | SA2 | 10.00 | H16 | 1.00 | S1 | 89.00 | 5.3 | 87.7 | 88.1 | 75.7 |
| Ex. 42 | SA2 | 10.00 | H17 | 1.00 | S1 | 89.00 | 7.9 | 85.0 | 84.7 | 70.6 |
| Ex. 43 | SA2 | 10.00 | H18 | 1.00 | S1 | 89.00 | 7.9 | 88.1 | 89.0 | 76.1 |
| Ex. 44 | SA2 | 10.00 | H19 | 1.00 | S1 | 89.00 | 7.2 | 82.4 | 83.6 | 70.5 |
| Ex. 45 | SA2 | 10.00 | H20 | 1.00 | S1 | 89.00 | 9.9 | 88.7 | 89.2 | 76.6 |
| Ex. 46 | SA2 | 10.00 | H21 | 1.00 | S1 | 89.00 | 9.1 | 85.1 | 86.3 | 75.6 |
| Ex. 47 | SA2 | 10.00 | H22 | 1.00 | S1 | 89.00 | 9.9 | 85.7 | 85.0 | 73.7 |
| Ex. 48 | SA2 | 10.00 | H23 | 1.00 | S1 | 89.00 | 11.0 | 83.4 | 85.2 | 68.2 |
| Ex. 49 | SA2 | 10.00 | H24 | 1.00 | S1 | 89.00 | 7.2 | 89.2 | 90.1 | 77.2 |
| Ex. 50 | SA2 | 10.00 | H25 | 1.00 | S1 | 89.00 | 11.3 | 79.4 | 80.0 | 68.6 |
| Ex. 51 | SA2 | 10.00 | H26 | 4.28 | S1 | 85.72 | 1.0 | 72.5 | 68.4 | 44.7 |
| Ex. 52 | SA2 | 10.00 | H27 | 7.38 | S1 | 82.62 | 1.0 | 70.0 | 68.8 | 40.8 |

From comparison of Comparative Example 1 with Examples 1 to 3, comparison of Comparative Example 2 with Examples 4 to 6, comparison of Comparative Example 3 with Examples 5 to 9, comparison of Comparative Example 7 with Example 22, as well as comparison of Comparative Example 8 with Example 23, it is found that when the surface treatment agent contains a silylation agent together with a nitrogen-containing heterocyclic compound which does not include a silicon atom, the efficiency of hydrophobization by a silylation agent at the time of surface treatment is remarkably improved.

From comparison of Comparative Example 1 with Comparative Examples 4 and 5, it is found that the efficiency of hydrophobization by a silylation agent at the time of surface treatment is not so much improved even when the nitrogen-containing heterocyclic compound is contained in the surface treatment agent as a silylation agent including a silicon atom.

From comparison of Example 6 with Examples 10 to 13 and Examples 24 to 33, it is found that the surface treatment agent containing a silylation agent together with a nitrogen-containing heterocyclic compound which does not include a silicon atom can give an excellent surface treatment effect regardless of types of solvents.

From comparison of Example 6 with Examples 14 to 21 and Examples 34 to 52, it is found that a desired effect regarding improvement of the efficiency of hydrophobization by a silylation agent at the time of surface treatment can be obtained by using various compounds as the heterocyclic compound. In particular, according to Examples 15 to 19, 34, 37, 39, and 41 to 50, it is found that even when the content of the heterocyclic compound is slightly small, the excellent effect of hydrophobization by the surface treatment agent is not damaged so largely.

What is claimed is:

1. A surface treatment agent used in surface treatment of a treatment target, comprising:

a silylation agent selected from the group consisting of

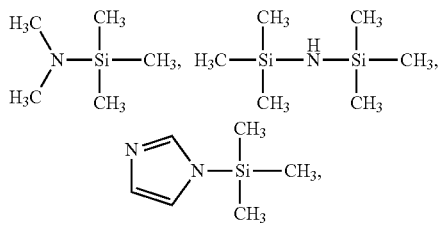

2,2,5,5-tetramethyl-2,5-disila-1-aza-cyclopentane and 2,2,4,4,6,6-hexamethylcyclotrisilazane; and a nitrogen-containing heterocyclic compound which does not include a silicon atom, said nitrogen-containing heterocyclic compound comprising (A) a nitrogen-containing five-membered ring or (B) a condensed polycyclic including a nitrogen-containing five-membered ring skeleteon, wherein the nitrogen-containing heterocyclic compound has an aromatic property; and at least one solvent selected from the group consisting of a dialkyl glycol ether, a (poly)alkylene glycol monoalkyl ether, a (poly)alkylene glycol monoalkyl ether acetate and a lactone.

2. A surface treatment method, comprising:

exposing a surface of a treatment target to the surface treatment agent according to claims 1; and treating the surface of the treatment target.

3. The surface treatment agent according to claim 1, wherein the nitrogen-containing heterocyclic compound comprises a substituted or non-substituted heterocyclic compound selected from a group consisting of pyrrole, pyrazole, imidazole, triazole, tetrazole, oxazole, isoxazole, thiazole, isothiazole, oxadiazole, thiadiazole, indole, indazole, benzimidazole, benzotriazole, benzoxazole, benzisoxazole, benzothiazole, benzoisothiazole, benzoxadiazole, benzothiadiazole, saccharin, and pyrrolidine.

4. The surface treatment agent according to claim 1, wherein the total concentration of the silylation agent and the nitrogen-containing heterocyclic compound is 0.1 to 30% by mass.

5. The surface treatment agent according to claim 1, wherein the amount of the nitrogen-containing heterocyclic compound is 0.1 to 20 moles relative to 1 mole of the silylation agent.

* * * * *